(12) United States Patent
Kwak

(10) Patent No.: US 6,320,801 B1
(45) Date of Patent: Nov. 20, 2001

(54) REDUNDANCY CIRCUIT AND REDUNDANCY METHOD FOR SEMICONDUCTOR MEMORY DEVICE

(75) Inventor: Jin Seok Kwak, Suwon (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/643,323

(22) Filed: Aug. 21, 2000

(30) Foreign Application Priority Data

Oct. 18, 1999 (KR) .................................................. 99-45083

(51) Int. Cl.[7] .................................................. G11C 29/00
(52) U.S. Cl. ............... 365/200; 365/189.05; 365/189.11; 365/201; 365/225.7
(58) Field of Search .................................. 365/200, 201, 365/225.7, 189.05, 189.11

(56) References Cited

U.S. PATENT DOCUMENTS

| | | | |
|---|---|---|---|
| 5,134,583 | * 7/1992 | Matsuo et al. | 365/200 |
| 5,208,778 | * 5/1993 | Kumanoya et al. | 365/201 |
| 5,970,021 | * 10/1999 | Sakurai | 365/233 |
| 6,101,618 | * 8/2000 | McClure | 714/27 |
| 6,144,592 | * 11/2000 | Kanda | 365/200 |

* cited by examiner

Primary Examiner—Son T. Dinh
(74) Attorney, Agent, or Firm—Skyjerven Morrill MacPherson LLP; David W. Heid

(57) ABSTRACT

A redundancy circuit of a semiconductor memory device includes a mode setting circuit that generates mode signal, an input selecting circuit that generates selecting signal in response to the mode signals, and a decoding circuit that, in response to the mode selecting signals, generates decoding signals. The redundancy mode signals include a bank redundancy mode signal, an array redundancy mode signal, and a column address group redundancy mode signal. The selecting signal identifies a bank in bank redundancy mode, an array in an array redundancy mode, and a column address group in column address group redundancy mode. The decoding signals initiate a replacement of a data I/O line pair associated to a defective memory cell in the semiconductor memory device. A redundancy method includes: generating the redundancy mode signals; generating the selecting signal in response to the redundancy mode signals; and generating the decoding signals.

22 Claims, 8 Drawing Sheets

REDUNDANCY CIRCUIT AND REDUNDANCY METHOD FOR SEMICONDUCTOR MEMORY DEVICE

BACKGROUND OF THE INVENTION

1. Field of the Invention

The present invention relates to a semiconductor memory device and more particularly, a semiconductor memory device having a redundancy circuit.

2. Description of the Related Invention

Modern graphic systems with enhanced resolution and three-dimensional capability often include RAMBUS™ DRAM (Dynamic Random Access Memory) or MMLs (Merged Memory Logic) to satisfy the memory requirements for effective graphic operation. RAMBUS DRAMs and MMLs have more data I/O (input and output) lines than column select lines to increase data I/O bits. These semiconductor memory devices have word lines and column select lines extending in the same direction and data I/O lines and bit lines extending perpendicular to the word lines.

The above-described semiconductor memory devices generally include redundant data I/O lines connected to redundancy memory cells for replacement of defective memory cells and associated data I/O lines. Using these redundancy circuits, a redundancy method can replace a defective bank, block, or column address group with a redundant bank, block, or column address group.

FIG.1 is a block diagram of a semiconductor memory device using a known bank redundancy method. The semiconductor memory device includes two memory cell array banks BANK0 and BANK1, and each of the two memory cell array banks BANK0 and BANK1 contains four memory cell arrays BLA, BLB, BLC, and BLD. Each of the four memory cell arrays includes a normal block NB and a redundant block RB. In a bank redundancy method, if a partial block ① of array BLA of bank BANK0 and a partial block ② of array BLA of bank BANK1 are defective, partial blocks ① and ② and all partial blocks in corresponding locations of arrays BLB, BLC, BLD, are replaced with redundant blocks RB. Redundant blocks RB thus replace the partial blocks hatched on the left portions of arrays BLA, BLB, BLC, and BLD. Accordingly, a data I/O line IO1 associated with the replaced blocks is replaced with a redundant data I/O line RIO.

If partial block ② of array BLA and a partial block ③ of array BLB of bank BANK1 are defective, one of the partial blocks ② and ③ can be replaced with the redundant block RB, but the other partial block cannot be replaced with the redundant block RB. Accordingly, the bank redundancy method cannot repair this pattern of memory cell defects. That is, the bank redundancy method cannon repair the defective memory when two or more data il lines are associated with defective memory cells. A block redundancy method can repair the partial blocks ② and ③. FIG. 2 is a block diagram of a semiconductor memory device using a known block redundancy method. The device has the same structure as the device of FIG. 1. Referring to FIG. 2, when partial blocks ①' and ②' of arrays BLA and BLB of BANK0 are defective, the block redundancy method replaces defective partial blocks ①' and ②' with redundant blocks RB of blocks BLA and BLB of bank BANK0. The method further replaces partial blocks (hatched in the same fashion as partial blocks ①' and ②')of bank BANK1, which are equivalently located to partial blocks ①' and ②' of bank BANK0, with redundant blocks RB of the memory cell arrays BLA and BLB of bank BANK1. In this method, redundant date I/O line RIO replaces data I/O line IO1 or IO4 depending on the array accessed.

When partial blocks ①' and ③' of array BLA of bank BANK0 are defective, only one of partial blocks ①' of the memory cell array block BLA can be replaced with the redundant partial block RB of array BLA. That is, the block redundancy method cannot repair multiple defective partial blocks in the same memory cell array.

FIG. 3 is a block diagram of a semiconductor memory device using a known column address group redundancy method. The device has the same structure as the device of FIG except that each partial block (including redundant partial block RB) includes four portions distinguished by column address group.

When defective portions ①" and ②" of array BLA of bank BANK0 are in different column address groups, the column address group redundancy method replaces defective portions ①" and ②" of bank BANK0 (and all portions of banks BANK0 and BANK1 in the same columns as portions ①" and ②") with the portions of redundant partial blocks RB that are respectively associated with the same column address group as portions ①" and ②". In FIG. 3, the crosshatched portions replace the hatched portions in respective arrays BLA, BLB, BLC, and BLD. Here, redundant data I/O line RIO replaces data I/O lines I01 and I04 when accessing columns corresponding to portions ①" and ②".

However, when portions ①" and ③", which are associated to the same column address group, are defective, the column address group redundancy method can replace only one of portions ①" and ③" with the corresponding portion of redundant partial block RB. That is, the column address group redundancy method cannot repair this kind of defect pattern.

Semiconductor memory devices usually select one of the three redundancy methods described above and thus cannot repair all kinds of defective memory cell patterns.

SUMMARY OF THE INVENTION

An embodiment of the present invention is a redundancy circuit of a semiconductor memory device. The redundancy circuit includes: a mode setting circuit that generates mode signals, which respectively correspond to redundancy modes; an input selecting circuit that generates mode selecting signals in response to the mode signals; and a decoding circuit that, in response to the mode selecting signals, generates decoding signals that initiate a replacement of a data I/O line pair associated with a defective memory cell in the semiconductor memory device.

One embodiment of the decoding circuit includes: a defective address setting circuit that receives the mode selecting signals and generates a redundancy operation control signal and data I/O line pair address signals; a predecoder that receives the redundancy operation control signal and the address signals and generates pre-decoding signals; and decoders that decode the pre-decoding signals and generate decoding signals.

The mode signals include a bank redundancy mode signal, a block redundancy mode signal, and a column address group redundancy mode signal. The mode selecting signals include a bank selecting signal, a block selecting signal, and a column address group selecting signal.

Another embodiment of the present invention is a redundancy method for a semiconductor memory device that includes a mode setting circuit, an input selecting circuit, and a decoding circuit. The method includes: generating, in the mode setting circuit, redundancy mode signals, which respectively correspond to redundancy modes; generating, in the input selecting circuit, mode selecting signals in response to the redundancy mode signals; and generating, in the decoding circuit, decoding signals that initiate a replacement of a data I/O line pair associated to a defective memory cell, in response to the mode selecting signals.

In one embodiment of the method, the decoding signals indicate the location of the defective data I/O line pair, so that the defective data I/O line pair is replaced by a redundant data I/O line pair. In another embodiment, the decoding signals indicate the location of the defective data I/O line pair, so that data I/O line pairs on one side of the defective data I/O line pair replaces the defective data I/O line by shifting one by one until the redundant data I/O line pair is shifted.

BRIEF DESCRIPTION OF THE DRAWINGS

Use of the same reference symbols in different figures indicates similar or identical items.

DETAILED DESCRIPTION OF PREFERRED EMBODIMENTS

In accordance with an aspect of the present invention, a semiconductor device employs a redundancy system that can select one among bank, block, and column address group redundancy depending on the pattern of memory cell defects.

Figures 1, 2, 3:
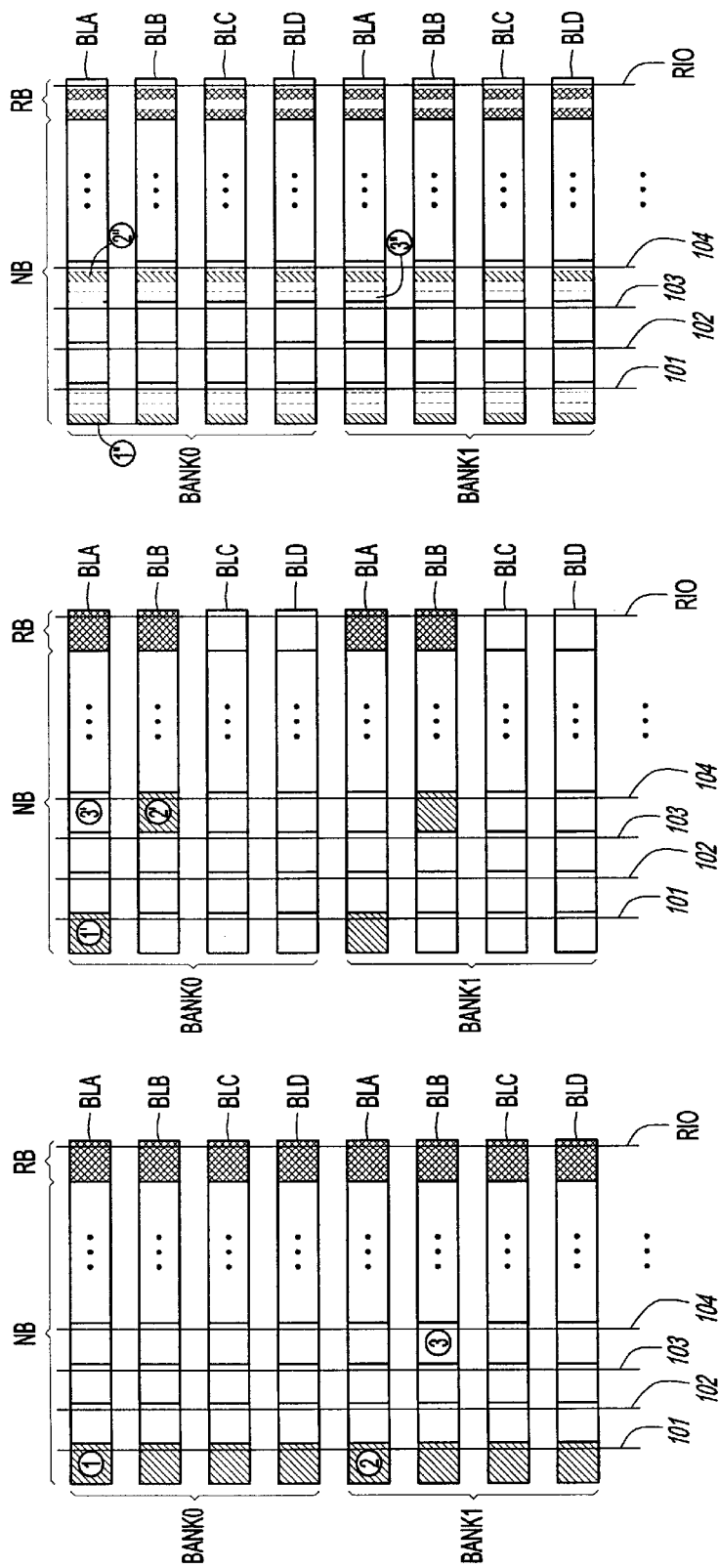
FIG. 1 is a partial block diagram of a memory cell array illustrating a known bank redundancy method of a semiconductor memory device.
FIG. 2 is a partial block diagram of a memory cell array illustrating a known block redundancy method of a semiconductor memory device.
FIG. 3 is a partial block diagram of a memory cell array illustrating a column address group redundancy method of a semiconductor memory device.
Figure 4:
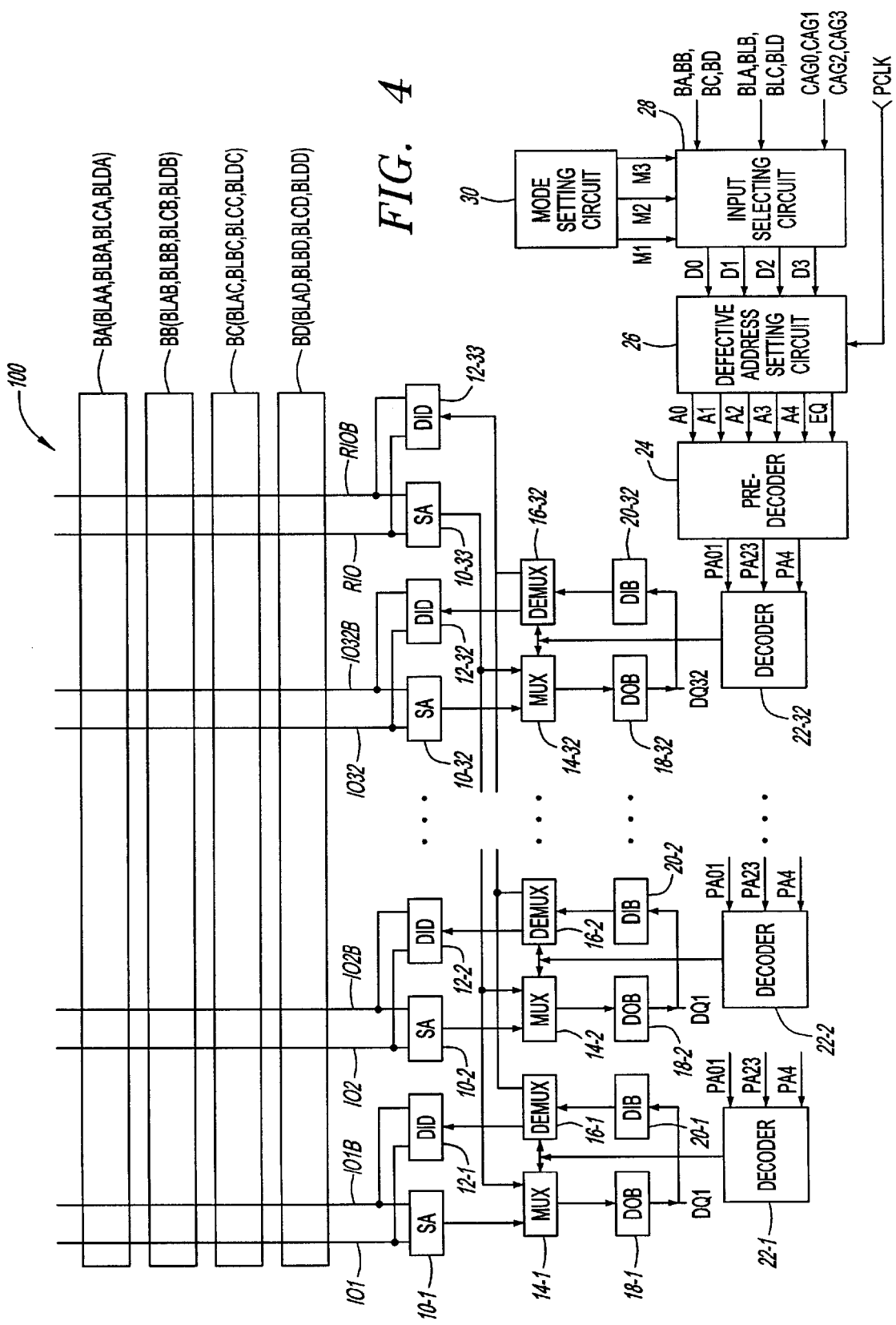
FIG. 4 is a block diagram of a semiconductor memory device according to an embodiment of the present invention.

FIG. 4 is a block diagram of a semiconductor memory device 100 according to an embodiment of the present invention. Memory device 100 includes four memory cell array banks BA, BB, BC, and BD. The four memory cell array banks BA, BB, BC, and BD respectively include memory cell array blocks (BLAA, BLBA, BLCA, BLDA), (BLAB, BLBB, BLCB, BLDB), (BLAC, BLBC, BLCC, BLDC), and (BLAD, BLBD, BLCD, BLDD). Peripheral circuitry of memory device 100 includes sense amplifiers 10-1 to 10-33, data input drivers 12-1 to 12-33, multiplexers 14-1 to 14-32, demultiplexers 16-31 to 16-32, data output buffers 18-1 to 18-32, data input buffers 20-1 to 20-32, decoders 22-1 to 22-32, a defective address setting circuit 26, an input selecting circuit 28, and a mode setting circuit 30. Memory device 100 further includes data I/O line pairs (IO1 and IO1B) to (IO32 and IO32B) and a redundant data I/O line pair (RIO and RIOB) that connect to memory cell array banks BA, BB, BC, and BD.

In FIG. 4, SA, DID, MUX, DEMUX, DOB, and DIB respectively denote a sense amplifier, a data input driver, a multiplexer, a demultiplexer, a data output buffer, and a data input buffer. SBA, SBB, SBC, and SBD respectively denote bank selecting signals that select one of memory cell array banks BA, BB, BC, and BD. SBLA, SBLB, SBLC, and SBLD respectively denote block selecting signals that select one of the memory cell array blocks (BLAA, BLAB, BLAC, BLAD), (BLBA, BLBB, BLBC, BLBD), (BLCA, BLCB, BLCC, BLCD), and (BLDA, BLDB, BLDC, BLDD) in the selected bank. CAG0, CAG1, CAG2, and CAG3 respectively denote column address selecting signals that select a column address group for the access.

Referring to FIG. 4, in a read operation, sense amplifiers 10-1 to 10-32 amplify data signals on respective data I/O line pairs (IO1,IO1B) to (IO32, IO32B). Sense amplify 10-33 amplifies the data signal on redundant data I/O line pair (RIO, RIOB). Multiplexers 14-1 to 14-32 select either the output signal from respective sense amplifiers 10-1 to 10-32 or the output signal from sense amplifier 10-33.

In write operation, data input drivers 12-1 to 12-32 transfer write data to data I/O line pairs (IO1, IO1B) to (IO32, IO32B), respectively, and data input driver 12-33 transfers write data to redundant data I/O line pair (RIO, RIOB). More specifically, absent memory cell defects, demultiplexers 16-1 to 16-32 provide respective input data bits from data input buffers 20-1 to 20-32 to respective data input drivers 12-1 to 12-32.

Sense amplifier 10-33 and data input driver 12-33 are used only in redundancy operation, and thus unused when no memory cells are defective. Multiplexers 14-1 to 14-32 select between output signals of sense amplifiers 14-1 to 14-32 and output signal of sense amplifier 10-33 in response to output signals of decoders 22-1 to 22-32, respectively. Demultiplexers 16-1 to 16-32 receive signals from data input buffers 20-1 to 20-32 and transfers the signals to data input drivers 12-1 to 12-32 or data input driver 12-33 again depending on the output signals of decoders 22-1 to 22-32, respectively. Data output buffers 18-1 to 18-32 buffer the signals from multiplexers 14-1 to 14-32 and output the buffered data signals to data I/O terminals DQ1 to DQ32 of memory device 100. Data input buffers 20-1 to 20-32 buffer input data signals from data I/O terminals DQ1 to DQ32 and output the buffered data signals to demultiplexers 16-1 to 16-32, respectively.

Mode setting circuit 30 selectively generates a mode signal M1 for a bank redundancy operation, a mode signal M2 for a block redundancy operation, or a mode signal M3 for a column address group unit redundancy operation, and sends the generated mode signal to input selecting circuit 28. Signals SBA, SBB, SBC, SBD, SBLA, SBLB, SBLC, SBLD, CAG0, CAG1, CAG2, and CAG3 are derived from the address signal input to memory 100 for a read or write operation. Input selecting circuit 28 uses bank signals SBA to SBD, block signals SBLA to SBLD, or column address group signals CAG0 to CAG3 depending on the mode signal from mode setting circuit 30 to generate signals D0, D1, D2, and D3 to defective address setting circuit 26. Receiving signals D0, D1, D2, and D3, defective address setting circuit 26 outputs signals A0, A1, A2, A3, and A4 and a control signal EQ to predecoder 24. Signals A0 to A4 identify one pair among I/O lines (IO1, IO1B) to (IO32, IO32B) for replacement by redundant I/O lines RIO and RIOB. Predecoder 24 predecodes signals A0, A1, A2, A3, and A4 in response to the control signal EQ and outputs decoding output signals PA01, PA23, and PA4 to decoders 22-1 to 22-32. Decoding signals PA01, PA23, and PA4 facilitate address decoding and are multi-bit signals indicating logical combinations of address signals A0, A1, A2, A3, and A4 and their complements. Decoders 22-1 to 22-32 decode signals PA01, PA23, and PA4 and output control signals for respective multiplexers 14-1 to 14-32 and demultiplexers 16-1 to 16-32.

Figure 5:
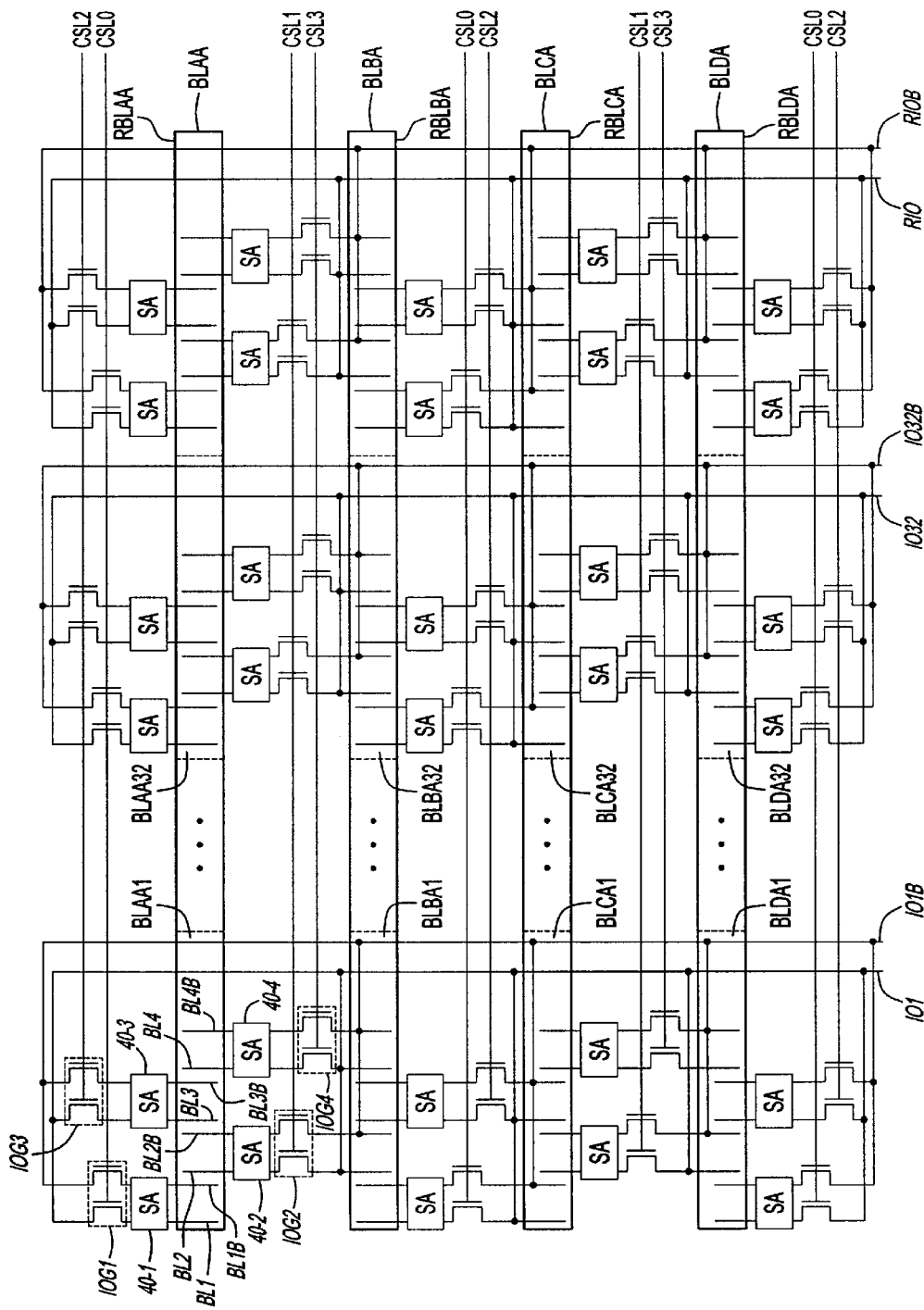
FIG. 5 is a circuit diagram of a memory cell array bank of FIG. 4.

FIG. 5 is a partial block diagram of memory cell array bank BA of FIG. 4. Memory cell array bank BA includes four memory cell array blocks BLAA, BLBA, BLCA, and BLDA. Each I/O line pair (IO1, IO1B) to (IO32, 1032B) corresponds to four pairs of bit lines in each memory cell array blocks BLAA, BLBA, BLCA, and BLDA. For example, I/O lines IO1 and IO1B correspond to bit lines BL1, BL1B, BL2, BL2B, BL3, BL3B, BL4, and BL4B in array block BLAA. Column select line pairs (CSL2, CSL0) and (CSL1, CSL3) are next to memory cell array blocks BLAA, BLBA, BLCA, and BLDA, and operate to connect I/O line pairs (I01, I01B) to (I032, I032B) to a corresponding bit line pair in each array block BLAA to BLAD.

Memory cell array BLAA includes thirty-two partial blocks BLAA1 to BLAA32 that are respectively connected to data I/O line pairs (IO1, IO1B) to (IO32, I032B) and a redundant partial block RBLAA that is connected to redundant data I/O line pair (RIO, RIOB). Similarly, memory cell arrays BLBA, BLCA, and BLDA respectively include partial blocks BLBA1 to BLBA32, BLCA1 to BLCA32, and BLDA1 to BLDA32, and redundant blocks RBLBA, RBLCA, and RBLDA.

Partial block BLAA1 includes data I/O gates IOG1, IOG2, IOG3, and IOG4, which are connected to column select lines CSL0, CSL1, CSL2, and CSL3, respectively. Sense amplifiers 40-1 to 40-4 are between data I/O gates IOG1, IOG2, IOG3, and IOG4 and bit line pairs (BL1, BL1B), (BL2, BL2B), (BL3, BL3B), and (BL4, BL4B). All other partial blocks and redundant partial blocks RBLAA, RBLBA, RBLCA, and RBLDA are similarly structured to partial block BLAA1.

Each of partial blocks BLBA1 to BLBA32, BLCA1 to BLCA32, and BLDA1 to BLDA32, and redundant blocks RBLBA, RBLCA, and RBLDA includes four sub-partial blocks (not shown), each of which connects to one of column select lines CSL0, CSL1, CSL2, and CSL3. The sub-partial blocks, which are memory cells (not shown), respectively connect to data I/O gates IOG1, IOG2, IOG3, and IOG4 and bit line pairs (BL1, BL1B), (BL2, BL2B), (BL3, BL3B), and (BL4, BL4B).

Figure 6:
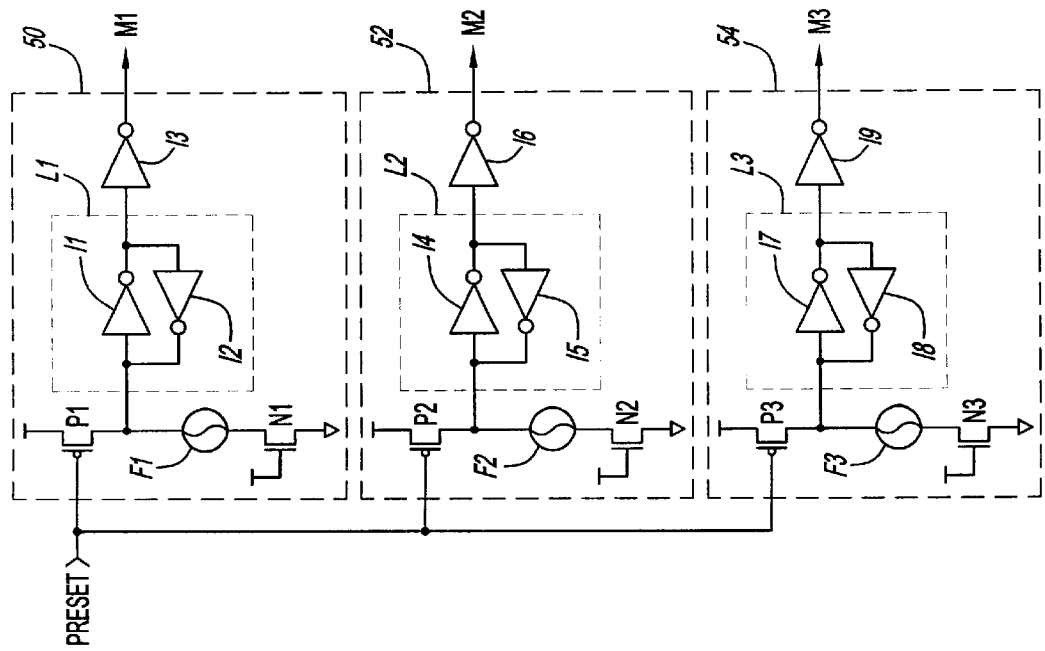
FIG. 6 is a circuit diagram of a mode setting circuit of FIG. 4.

FIG. 6 is a circuit diagram of an embodiment of mode setting circuit 30 of FIG. 4. Mode setting circuit 30 includes mode selecting signal generators 50, 52, and 54 that respectively generate mode selecting signals M1, M2, and M3.

Mode selecting signal generator 50 includes a PMOS transistor P1, an NMOS transistor N1, a fuse F1, a latch L1 containing inverters I1 and I2, and an inverter I3. Mode selecting signal generator 52 includes a PMOS transistor P2, an NMOS transistor N2, a fuse F2, a latch L2 containing inverters I4 and I5, and an inverter I6. Mode selecting signal generator 54 includes a PMOS transistor P3, an NMOS transistor N3, a fuse F3, a latch L3 containing inverters I7 and I8, and an inverter I9. Mode selecting signal generators 50, 52, and 54 are substantially identical except that one of fuses F1, F2, and F3 is cut to select a redundancy mode.

In the operation of mode selecting signal generator 50, when power supply is turned on, a preset signal PRESET that is set at a low level turns on PMOS transistor P1. When fuse F1 is cut, PMOS transistor P1 outputs a high level signal to latch L1, and latch L1 inverts the high level signal, and latches and outputs a low level signal. Inverter I3 inverts the low level signal and outputs a high level signal. When fuse F1 is not cut, PMOS transistor P1 and NMOS transistor N2 provide a low level signal to latch L1, and latch L1 inverts the low level signal, and latches and outputs a high level signal. Inverter I3 inverts the high level signal and outputs a low level signal. Accordingly, mode selecting signal generator 50 generates mode selecting signal M1 at a high level when fuse F1 is cut. The operations of mode selecting signal generators 52 and 54 are similar to that of mode selecting signal generator 50.

Memory device 100 employs a bank redundancy mode by cutting fuse F1 and leaving fuses F2 and F3 intact, so that mode selecting signal M1 is at a high level, and mode selecting signals M2 and M3 are at a low level.

Memory device 100 employs an array redundancy mode by cutting fuse F2 and leaving fuses F1 and F3 intact, so that mode selecting signal M2 is at a high level, and mode selecting signals M1 and M3 are at a low level. Memory device 100 employs a column address group redundancy mode by cutting fuse F3 and leaving fuses F1 and F2 intact, so that mode selecting signal M3 is at a high level, and mode selecting signals Ml and M2 are at a low level.

Figure 7:
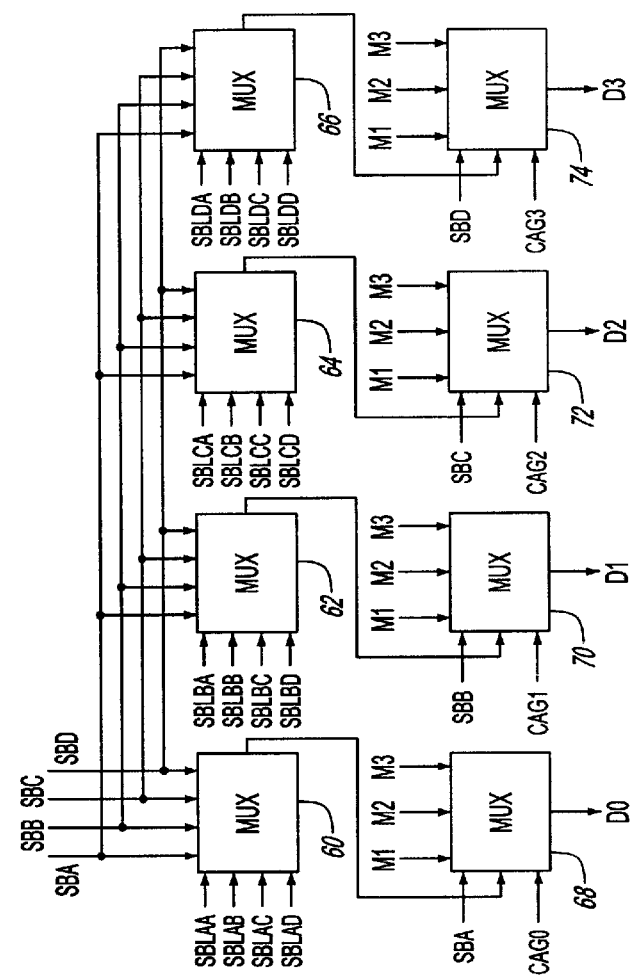
FIG. 7 is a block diagram of an input selecting circuit of FIG. 4.

FIG. 7 is a block diagram of input selecting circuit 28 of FIG. 4. Input selecting circuit 28 includes four 4-to-1 multiplexers 60, 62, 64, and 66, and four 3-to-1 multiplexers 68, 70, 72, and 74. Bank selecting signals SBA, SBB, SBC, and SBD are activated to select memory cell array banks BA, BB, BC, and BD, respectively. Array selecting signals SBLA, SBLB, SBLC, and SBLD (FIG. 4) are 4-bit signals and respectively composed of signal sets (SBLAA, SBLAB, SBLAC, SBLAD), (SBLBA, SBLBB, SBLBC, SBLBD), (SBLCA, SBLCB, SBLCC, SBLCD), and (SBLDA, SBLDB, SBLDC, SBLDD). Signal sets (SBLAA, SBLAB, SBLAC, SBLAD), (SBLBA, SBLBB, SBLBC, SBLBD), (SBLCA, SBLCB, SBLCC, SBLCD), and (SBLDA, SBLDB, SBLDC, SBLDD) respectively select memory cell array blocks (BLAA, BLAB, BLAC, BLAD), (BLBA, BLBB, BLBC, BLBD), (BLCA, BLCB, BLCC, BLCD), and (BLDA, BLDB, BLDC, BLDD). Column address group selecting signals CAG0, CAG1, CAG2, and CAG3 denote signals corresponding to column select line signals CSL0, CSL1, CSL2, and CSL3 (FIG. 5),respectively.

Referring to FIG. 7, multiplexer 60, in response to bank selecting signals SBA, SBB, SBC, and SBD, selects one of signals SBLAA, SBLAB, SBLAC, and SBLAD, respectively, and outputs the selected one to multiplexer 68. Multiplexer 62, in response to bank selecting signals SBA, SBB, SBC, and SBD, selects one of signals SBLBA, SBB, SBLBC, and SBLBD, and outputs the selected one to multiplexer 70. Multiplexer 64, in response to bank selecting signals SBA, SBB, SBC, and SBD, selects one of signals SBLCA, SBLCB, SBLCC, and SBLCD, respectively, and outputs the selected one to multiplexer 72.

Multiplexer 66, in response to bank selecting signals SBA, SBB, SBC, and SBD, selects one of signals SBLDA, SBLDB, SBLDC, and SBLDD, and outputs the selected one to multiplexer 74. Accordingly, multiplexers 60, 62, 64, and 66 provide one of the signal sets (SBLAA, SBLAB, SBLAC, SBLAD), (SBLBA, SBLBB, SBLBC, SBLBD), (SBLCA, SBLCB, SBLCC, SBLCD), or (SBLDA, SBLDB, SBLDC, SBLDD) depending on which of banks BA, BB, BC, and BD is being accessed.

Multiplexer 68 receives bank selecting signals SBA, the signal from multiplexer 60, and column address group selecting signal CAG0. In response to mode selecting signal M1, M2, and M3, multiplexer 68 selects bank selecting signals SBA, the signal from multiplexer 60, and column address group selecting signal CAG0, respectively, and outputs the selected signal as signal D0. Multiplexer 70 receives bank selecting signals SBB, the signal from multiplexer 62, and column address group selecting signal CAG1. In response to mode selecting signal M1, M2, and M3, multiplexer 70 selects bank selecting signals SBB, the signal from multiplexer 62, and column address group selecting signal CAG1, respectively, and outputs the selected signal as signal D1. Multiplexer 72 receives bank selecting signals SBC, the signal from multiplexer 64, and column address group selecting signal CAG2. In response to mode selecting signal M1, M2, and M3, multiplexer 72 selects bank selecting signals SBC, the signal from multiplexer 64, and column address group selecting signal CAG2, respectively, and outputs the selected signal as signal D2. Multiplexer 74 receives bank selecting signals SBD, the signal from multiplexer 66, and column address group selecting signal CAG3. In response to mode selecting signal M1, M2, and M3, multiplexer 74 selects bank selecting signals SBC, the signal from multiplexer 66, and column address group selecting signal CAG3, respectively, and outputs the selected signal as signal D3.

Figure 8A:
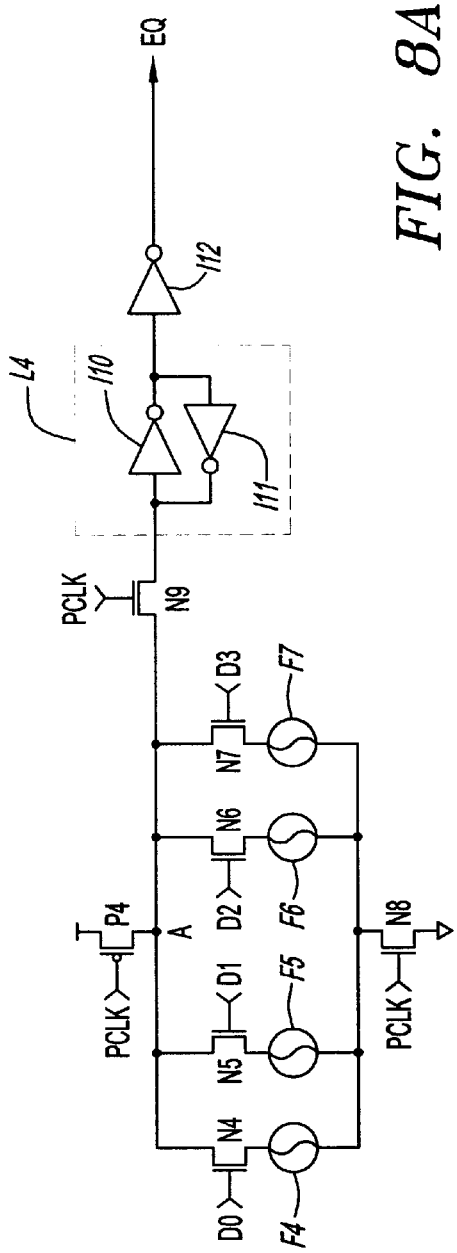
FIG. 8A is a circuit diagram of a signal (EQ) generator of a defective address setting circuit of FIG. 4.

FIG. 8A illustrates an embodiment of a signal generator in defective address setting circuit of FIG. 4. In the generation of signal EQ, a clock signal PCLK of a low level turns on PMOS transistor P4 and turns off an NMOS transistor N8, causing PMOS transistor P4 to transfer a high level signal to a node A thereby precharging node A. When redundancy operation is not required, none of fuses F4, F5, F6, and F7 are cut. When one among signals D0, D1, D2, and D3 is at a high level, node A transits to a low level when clock signal PCLK goes to a high level. The low level signal at node A is transferred to a latch L4 in response to clock signal PCLK at the high level being applied to NMOS transistor N9. Latch L4 inverts the low level signal, and generates and latches a high level signal. Inverter 112 inverts the high level signal and generates signal EQ at a low level.

When a redundancy operation is required, the fuse associated to the transistor receiving a high level signal is cut. For example, if among signals D0 to D4 only signal D1 is at a high level for a redundancy operation, fuse F5 is cut and fuses F4, F6, and F7 are not cut. Accordingly, the redundancy operation maintains the high level signal at node A. The high level signal at node A transfers to a latch L4 in response to clock signal PCLK at the high level being applied to NMOS transistor N9. Latch L4 inverts the high level signal from node A, and generates and latches a low level signal. Inverter 112 inverts the low level signal and generates signal EQ at a high level. An exemplary bank redundancy operation is explained with respect to FIGS. 4 and 8A. If memory cell array banks BA and BC have defective cells, fuses F4 and F6 are cut because signals D0 and D2 applied to NMOS transistors N4 and N6 are at a high level when accessing banks BA and BB respectively in the bank redundancy mode. Fuses F5 and F7 are not cut because signals D1 and D3 applied to NMOS transistors N5 and N7 are at a low level when accessing bank BA or BC in the bank redundancy mode. In the redundancy operation, signal D0 or D2 is at a high level. When signal D0 is high, signals D1, D2, and D3 are low. When signal D2 is high, signals D0, D1, and D3 are low. When signal D0 or D2 is high, the signal of node A remains at a high level, and signal EQ of a high level is generated. The high signal EQ enables the redundancy operation.

Figure 8B:
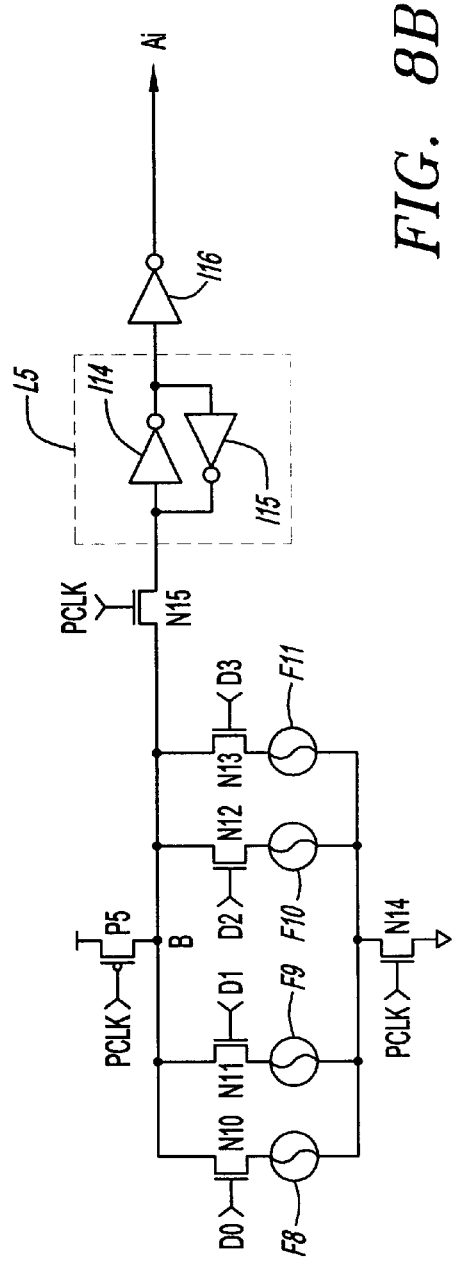
FIG. 8B is a circuit diagram of an address generator of a defective address setting circuit of FIG. 4.

FIG. 8B is a circuit diagram of an embodiment of an address generator in defective address setting circuit 26 of FIG. 4. The address generator includes NMOS transistors N10, N11, N12, N13, N14, and N15, a PMOS transistor P5, fuses F8, F9, F10, and F11, a latch L5 including inverters 114 and 115, and an inverter 116. The address generator generates one of bit address A0 to A5. Accordingly, defective address setting circuit 26 includes five address generators to generate five bit address bits A0, A1, A2, A3, and A4.

Referring to FIG. 8B, PMOS transistor P5 and NMOS transistor N14 respectively turn on and off in response to clock signal PCLK being at a low level, and this precharges a node B to a high level. When the fuses associated with the NMOS transistors, to which signals D0, D1, D2, and D3 at a high level are applied, are cut. Then, NMOS transistor N15 transfers the high level signal from node B to latch L5 in response to the clock signal PCLK being at a high level. Latch L5 generates a low level signal by inverting the transferred high level signal and latches the low level signal. Inverter I16 inverts the low level signal and generates a high level address signal Ai. On the other hand, when none of fuses F8 to F11 are cut, the signal at node B transits to a low level when signal PCLK and any of signals D0 to D3 are at the high level. Accordingly, the low level signal at node B transfers to latch L5 in response to clock signal PCLK being at a high level at NMOS transistor N15. Then, latch L5 generates a high level signal by inverting the low level signal and latches the high level signal. Inverter I16 generates a low level address signal Ai by inverting the high level signal.

As described above, defective address setting circuit 26 including five address generators that generate five address signals A0, A1, A2, A3, A4, corresponding to addresses of thirty-two data I/O line pairs (IO1 and IO1B) to (IO32 and IO32B). The value of 5- bit address indicates which of the I/O line pairs is associated to defective memory cells. For example, five bit address signals A0, A1, A2, A3, and A4 set to 0, 0, 0, 0, and 0 designate I/O pair (IO1 and IO1B). Five bit address signals A0, A1, A2, A3, and A4 set to 1, 0, 0, 0, and 0 designate I/O pair (IO2 and IO2B). To produce this address in response to particular values of signals D0 to D3, only the fuses associated with the NMOS transistors receiving high level signals (among D0, D1, D2, and D3) in the A0 address generator are cut, and other fuses are not cut. If data I/O pair (IO12 and IO12B)are addressed as 0, 1, 0, 1, and 0, the fuses associated with the NMOS transistors receiving high level signals in the A1 and A3 address generators are cut, and other fuses are not cut. Data I/O line pairs connected to defective memory cells in the memory cell arrays of the banks are replaced by redundant data I/O line pair (RIO and RIOB).

The same defective address setting method is used in the bank, block and column address redundancy operations.

Figure 9:
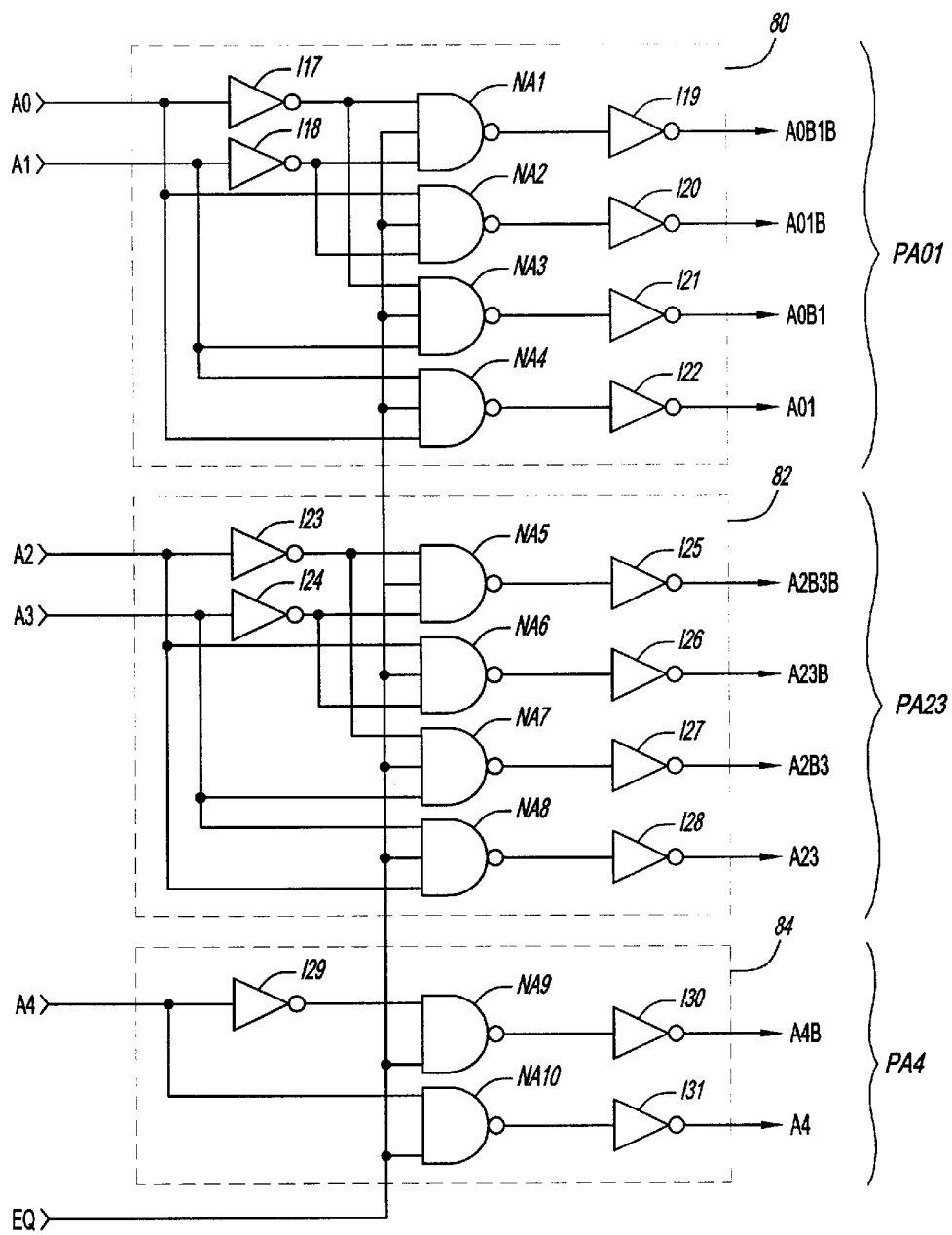
FIG. 9 is a circuit diagram of a predecoder of FIG. 4.

FIG. 9 a circuit diagram of an embodiment of predecoder 24 of FIG. 4. Predecorder 24 includes a first sub-precoder 80 that decodes address signals A0 and A1, a second sub-predecoder 82 that decodes address signals A2 and A3, and a third sub-predecoder 84 that decodes address signal A4.

Sub-predecoder 80 includes six inverters I17. I19, I20, I21, I21, and I22, and four NAND gates NA1, NA2, NA3, and NA4. Sub-predecoder 84 includes six inverters I23, I24, I25, I26, I27, and I31, and four NAND gates NA5, NA6, NA7, NA8. Sub-predecoder 84 includes three inverters I29, I30, I31, and two NAND gates NA9 and NA10.

Inverters I17 and I18 generate an inverted address signals by inverting address signals A0 and A1. A decoding output signal A0B1B from inverter I19 is high when signal EQ and the output signals of inverters 117 and 118 are high. A decoding output signal A01B from inverter 120 is high when signal EQ, signal A0, and the output signal of inverter I18 are high. A decoding output signal A0B1 from inverter I21 is a high-level signal when signal EQ, the output signal of inverter I17, and address signal A1 are high. A decoding output signal A01 from inverter I22 is a high level signal when signal EQ and address signals A0 and A1 are high. Sub-predecoder 82 generates decoding output signals A2B3B, A23B, A2B3, and A23 in a manner similar to the manner in which sub-predecoder 80 generates A0B1B, A01B, A0B1, and A01.

Inverter I29 inverts address signal A4. Inverter I30 or I31 activates a decoding output signal A4B or A4 when signal EQ is a high and signal A4 is high or low. For example, if address signal A4 is low, decoding output signal A4B is high. If address signal A4 is high, decoding output signal A4 is high.

Figure 10:
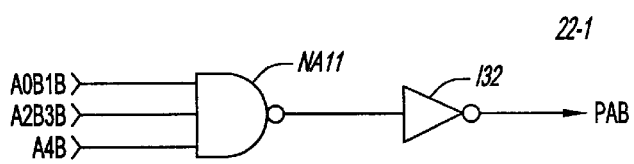
FIG. 10 is a circuit diagram of a decoder of FIG. 4.

FIG. 10 is a circuit diagram of decoder 22-1, which generates a control signal that controls multiplexer 14-1 and demultiplexer 16-1 (FIG. 4). Decoder 22-1 includes a NAND gate NA11 and an inverter I32. From among signals PA01, PA23, and PA4, signals A0B1B, A2B3B, and A4B are applied to input terminals of NAND gate NA11. This combination of input signals from among signals PA01, PA23, and PA4 is unique to the address associated with decoder 22-1. In particular, decoder 22-1 is associated with address 00000b, and predecoder 24 only activates signals A0B1B, A0B3B, and A4B to a high level when the redundancy scheme replaces I/O lines IO1 and IO1B with redundant I/O lines RIO and RIOB. Each of decoders 22-2 to 22-32 is structured identically to decoder 22-1 but has different input signal selected from among signals PA01, PA23, and PA4.

Returning to FIG. 4, decoders 22-1 to 22-32 respectively receive different combinations of one of signals A0B1B, A01B, A0B1, and A01, one of signals A2B3B, A23B, A2B3, and A23, and one of signals A4B and A4. For example, for decoder 22-1 of FIG. 4, signals PA01, PA23, and PA4 are signals A0B1B, A2B3B, and A4B, respectively. Decoder 22-32 in FIG. 4 uses from signals PA01, PA23, and PA4 only signals A01, A23, and A4.

Figure 11:
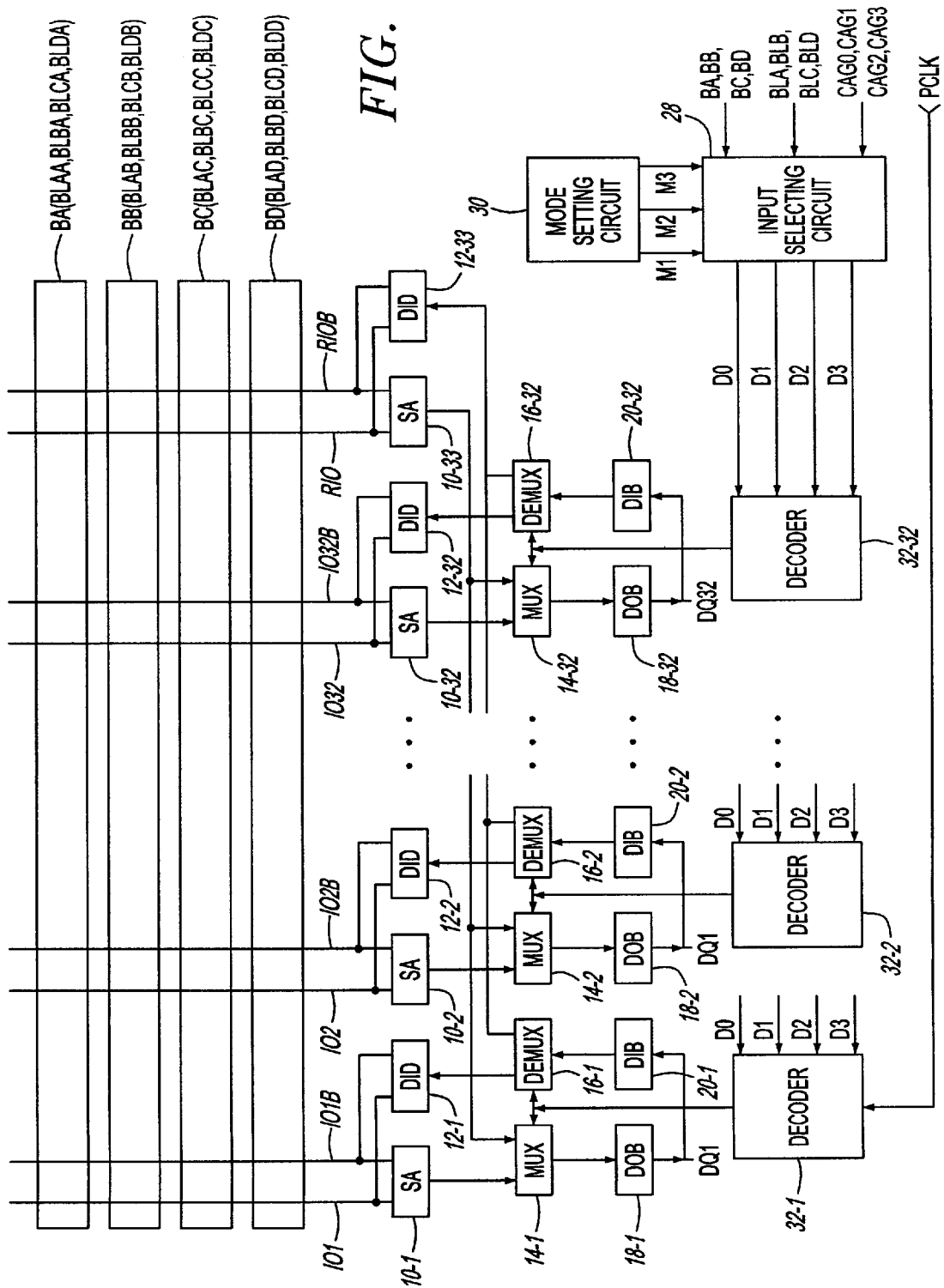
FIG. 11 is a block diagram of a semiconductor memory device according to another embodiment of the present invention.

FIG. 11 is a block diagram of a semiconductor memory device according to another embodiment of the present invention. The memory device of FIG. 11 is similar to the memory device of FIG. 4 but employs a different redundancy decoding and replacement system. Decoders 321 to 32-32 of FIG. 11 replace decoders 22-1 to 22-32, predecoder 24, and defective address setting circuit 26 of FIG. 4. Additionally, in the memory device of FIG. 11, multiplexers 14-1 to 14-32 receive data from either of a pair of adjacent sense amplifiers (10-1, 10-2) to (10-32, 10-33), respectively. Demultiplexers 12-1 to 12-32 output data to one of a pair of data input drivers (12-1, 12-2)) to (12-32, 12-33), respectively in the memory device of FIG. 11.

Figure 12:
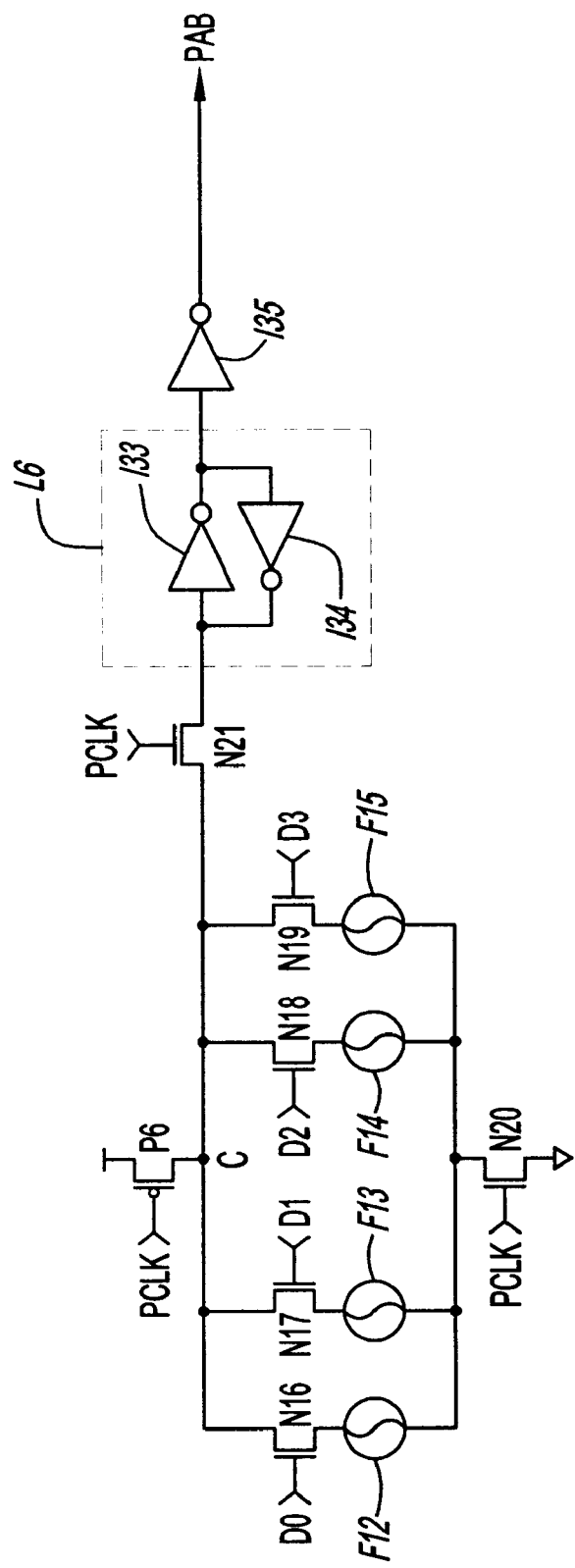
FIG. 12 is a circuit diagram of a decoder of FIG. 11.

Decoders 32-1 to 32-32 receive signals D0, D1, D2, and D3 from input selecting circuit 28. Each of decoders 32-1 to 32-32 is programmed to replace a data I/O line pair associated with defective memory cells with the data I/O line pair which are located to right side of the data I/O line pair associated to defective memory cells. All decoders to the right side of data I/O line pair associated with defective memory cells select the data I/O line pair to the right. For example, when data I/O line pair IO1 and IO1B is to be replaced, all decoders 32-1 to 32-32 activate their control signals to high levels. Then, multiplexers 14-1 to 14-32 receive the control signals and select the adjacent sense amplifiers 10-2 to 10-33, respectively. Similarly, demultiplexers 16-1 to 16-32 output the data from input buffers 20-1 to 20-32 to the adjacent data input drivers 12-2 to 12-33, respectively. Accordingly, for the replacement of data I/O line pair of defective memory cell, not only the decoder for the data I/O line pair of defective memory cell but also the decoders on the right side of the decoder produce high-level control signals. Then, each of the data I/O line pairs associated with the decoders producing high level signals is replaced with adjacent (right-side) data I/O line pair. FIG. 12 is a circuit diagram of an embodiment of decoder 32-1 of FIG. 11. Decoders 32-2 to 32-32 have the same structure as decoder 32-1. Decoder 32-1 includes a PMOS transistor P6, NMOS transistors N16, N17, N18, N19, N20, and N21, fuses F12, F13, F14, and F15, a latch including inverters I33 and I34, and inverter I35. The structure of decoder 32-1 is identical to that of the signal EQ generator of FIG. 8. Thus, the operation of decoder 32-1 is identical to that of the signal EQ generator.

Referring to FIGS. 11 and 12, clock signal PCLK, when at a low level, turns on PMOS transistor P6 so that PMOS transistor P6 precharges a node C to a high level. When redundancy operation is not required, none of fuses F12, F13, F14, and F15 are cut. When any of signals D0, D1, D2, and D3 are at a high level, node C transits to a low level when clock signal PCLK transits to a high level. Transistor N21 transfers the low level signal at node C to a latch L6 in response to clock signal PCLK being at a high level and turning on NMOS transistor N21. Latch L6 inverts the low level signal and generates and latches a high level signal. Inverter I35 inverts the high level signal and generates a signal PAB at a low level. Accordingly, if none of fuses F12 to F15 are cut, control signal PAB remains at a low level.

When redundancy operation is required, the fuse, among fuses F12, F13, F14, and F15, associated with the transistor receiving a high level signal is cut. For example, if among signals D0 to D4 only signal Dl is at a high level when replacement of an I/O line pair is required, fuse F13 is cut and fuses F4, F6, and F7 are left intact. Accordingly, the high level signal on node C is maintained when only signal D1 is at the high level. The high level signal at node C transfers to a latch L6 in response to clock signal PCLK being at a high level. Latch L6 inverts the high level signal from node C, and generates and latches a low level signal. Inverter I35 inverts the low level signal and generates signal PAB at a high level. Transistor N20 keeps node C from discharging if any of signals D0 to D3 are high when clock signal PCLK is low.

Referring to FIGS. 11 and 12, the low level signal PAB makes each of multiplexers 14-1 to 14-32 receive the output signal from a left one of a pair of the sense amplifiers connected to the multiplexer. For instance, at the low level signal PAB, multiplexer 14-1 selects the signal from sense amplifier 10-1, not sense amplifier 10-2. In contrast, the high level signal PAB makes the associated multiplexer receive the output signal from a right pair of the sense amplifiers connected to the multiplexer. For instance, at the high level signal PAB, multiplexer 14-1 selects the signal from sense amplifier 10-2, not from sense amplifier 10-1. As described above, for the replacement of data I/O line pair of defective memory cell, not only the decoder for the data I/O line pair of defective memory cell but also the decoders to the right side of that decoder are programmed so as to produce signal PAB at a high level. Decoders to the left are programmed to produce signal PAB at a low level. For example, when a memory cell connected to data I/O line pair IO4 and IO4B in memory cell array bank BA is defective, no fuses of decoders 32-1 to 32-3 are cut so as to output low level PAB signals. However, in decoders 32-4 to 32-32, the fuses corresponding to fuse F12 and associated with NMOS transistors N16 are cut so as to output high level PAB signals when signal D0 is activated to a high level. As noted above, input selecting circuit 28 activates signal D0 when bank BA is being accessed and the memory is operation in bank redundancy mode. Accordingly, for this redundancy operation, data I/O line pairs (IO1 and IO1B) to (IO3 and IO3B) and (IO5 and IO5B) to (RIO and RIOB) are used for accesses of bank BA.

Although the redundancy methods according to the present invention were described without latency operations, a known latency operation such as a CAS latency can be integrated with the redundancy methods. In addition, although the above-described redundancy methods employ only a pair of redundant data I/O lines, a number of redundant data I/O line pairs can be employed such that each of the redundant data I/O line pairs is assigned to a different group of data I/O line pairs.

The semiconductor memory device of the present invention, depending on the types of defective memory cell, can select among bank redundancy, block redundancy, and column address group unit redundancy methods.

Although the invention has been described with reference to particular embodiments, the description is only an example of the inventor's application and should not be taken as limiting. Various adaptations and combinations of features of the embodiments disclosed are within the scope of the invention as defined by the following claims.

What is claimed is:

1. A redundancy circuit of a memory device, comprising:
    a mode setting circuit that generates a mode signal corresponding to a plurality of redundancy modes;
    an input selecting circuit that generates a selecting signal in response to the mode signal and a plurality of signals identifying an area of the memory device for an access; and
    a decoding circuit that, in response to the selecting signal, generates control signals that control a replacememt of a data I/O line pair associated to a defective memory cell in the memory device.

2. The redundancy circuit of claim 1, wherein the mode setting circuit comprises a plurality of mode signal generating circuits, the mode signal generating circuits respectively corresponding to bits of the mode signal,
    wherein each of the mode signal generating circuits comprises:
        a pull-up transistor that pulls up a first node in response to a preset signal;
        a fuse serially connected to the pull-up transistor;
        a pull-down transistor serially connected to the fuse and a ground voltage; and
        a latch connected to latch a signal on the first mode.

3. The redundancy circuit of claim 2, wherein each of the mode signal generating circuits further comprises an inverter connected to the latch, the latch inverting and latching a signal from the pull-up transistor, and the inverter inverting a signal from the latch and generating a mode signal.

4. The redundancy circuit of claim 1, wherein the decoding circuit comprises:
    a defective address setting circuit that receives the selecting signal from the input selecting circuit and generates a redundancy operation control signal and a plurality of address signals, the address signals indicating the data I/O line pair associated with the defective memory cell;
    a predecoder that receives the redundancy operation control signal and the address signals from the defective address setting circuit and generates a plurality of pre-decoding signals; and
    a plurality of decoders that decode the pre-decoding signals and generate the control signal, wherein the control signal comprises a plurality of decoding signals, each of the decoders being associated with a corresponding data I/O line pair in the memory device.

5. The redundancy circuit of claim 4, wherein the defective address setting circuit comprises:
    a redundancy operation control signal setting circuit that generates the redundancy operation control signal; and
    a plurality of address setting circuits that generate the address signals.

6. The redundancy circuit of claim 5, wherein the redundancy operation control signal setting circuit comprises:
    a pull-up transistor that pulls up a first node in response to a clock signal;
    a plurality of pull-down transistors, the pull-down transistors connecting in parallel to one another, wherein each of the pull-down transistors having a drain connecting to the first node, a gate, to which one bit of the selecting signal is applied, and a source;
    a plurality of fuses, each of the fuses serially connecting to the source of one of the pull-down transistors, wherein the fuses commonly connect to a second node;
    a pull-down transistor that pulls down the second node in response to the clock signal;
    a transmission gate that transfers a signal from the first node in response to the clock signal;
    a latch that inverts the signal transferred through the transmission gate, and latches and generates an inverted signal; and
    an inverter that inverts the inverted signal from the latch and generates the redundancy operation control signal.

7. The redundancy circuit of claim 5, wherein each of the address setting circuits comprises:
    a pull-up transistor that pulls up a first node in response to a clock signal;
    a plurality of pull-down transistors, the pull-down transistors connecting in parallel to one another, wherein each of the pull-down transistors has a drain connecting to the first node, a gate, to which one bit of the selecting signal is applied, and a source;
    a plurality of fuses, each of the fuses serially connecting to the source of one of the pull-down transistors, wherein the fuses commonly connect to a second node;
    a pull-down transistor that pulls down the second node in response to the clock signal;
    a transmission gate that transfers a signal from the first node in response to the clock signal;

a latch that inverts the signal transferred through the transmission gate, and latches and generates an inverted signal; and an inverter that inverts the inverted signal from the latch and generates one of the address signals.

8. The redundancy circuit of claim 1, wherein the decoding circuit comprises a plurality of decoders.

9. The redundancy circuit of claim 8, wherein each of the decoders comprises:

a pull-up transistor that pulls up a first node in response to a clock signal;

a plurality of pull-down transistors, the pull-down transistors connecting in parallel to one another, wherein each of the pull-down transistors having a drain connected to the first node, a gate, to which one bit of the selecting signal is applied, and a source;

a plurality of fuses, each of the fuses serially connecting to the source of one of the pull-down transistors, wherein the fuses commonly connect to a second node;

a pull-down transistor that pulls down the second node in response to the clock signal;

a transmission gate that transfers a signal from the first node in response to the clock signal;

a latch that inverts the signal transferred through the transmission gate, and latches and generates an inverted signal; and an inverter that inverts the inverted signal from the latch and generates a data I/O line shifting control signal.

10. The redundancy circuit of claim 1, wherein the mode signal comprises:

a bank redundancy mode signal;

a block redundancy mode signal; and a column address group redundancy mode signal.

11. The redundancy circuit of claim 10, wherein the selecting signal comprises:

a bank selecting signal when the bank redundancy mode signal is activated;

a block selecting signal when the block redundancy mode signal is activated; and a column address group selecting signal when the column address group redundancy mode signal is activated.

12. A semiconductor memory device comprising:

a plurality of banks, each of the banks comprising a plurality of memory cell array blocks, each of the memory cell array blocks comprising a plurality of sub-blocks, wherein the blocks respectively connect to a plurality of data I/O line pairs, one or more of the data I/O line pairs being redundant, and column select line pairs which control which sub-block in a block is currently connected to the data I/O line pair connected to the block;

a mode setting circuit that generates a mode signal, the mode signal having states corresponding to a plurality of redundancy modes;

an input selecting circuit that generates a selecting signal in response to the mode signal and a plurality of signals identifying an area being accessed in the semiconductor memory device; and a decoding circuit that, in response to the selecting signal, generates a control signal that initiates replacement of a data I/O line pair associated to a defective memory cell in the semiconductor memory device.

13. The semiconductor memory device of claim 12, wherein the mode setting circuit comprises a plurality of mode signal generating circuits, the mode signal generating circuits respectively corresponding to bits of the mode signal, wherein each of the mode signal generating circuits comprises:

a pull-up transistor that pulls up a first node in response to a preset signal;

a fuse serially connected to the pull-up transistor;

a pull-down transistor serially connected to the fuse and a ground voltage;

a latch connected to the first node, the latch inverting and latching a signal from the first node; and an inverter connected to the latch, the inverter inverting a signal from the latch and generating bits of a mode signal.

14. The semiconductor memory device of claim 12, wherein the decoding circuit comprises:

a defective address setting circuit that receives the selecting signal from the input selecting circuit and generates a redundancy operation control signal and an address signal, the address signal indicating the data I/O line pair associated with the defective memory cell;

a predecoder that receives the redundancy operation control signal and the address signal from the defective address setting circuit and generates a plurality of pre-decoding signals; and a plurality of decoders that decode the pre-decoding signals and generate the control signal.

15. The semiconductor memory device of claim 14, wherein the defective address setting circuit comprises:

a redundancy operation control signal setting circuit that generates a redundancy operation control signal; and a plurality of address setting circuits that generate bits of the address signal.

16. The semiconductor memory device of claim 15, wherein the redundancy operation control signal setting circuit comprises:

a pull-up transistor that pulls up a first node in response to a clock signal;

a plurality of pull-down transistors, the pull-down transistors connecting in parallel to one another, wherein each of the pull-down transistors has a drain connected to the first node, a gate, to which one of the selecting signals is applied, and a source;

a plurality of fuses, each of the fuses serially connecting to the source of one of the pull-down transistors, wherein the fuses commonly connect to a second node;

a pull-down transistor that pulls down the second node in response to the clock signal;

a transmission gate that transfers a signal from the first node in response to the clock signal;

a latch that inverts the signal transferred through the transmission gate, and latches and generates an inverted signal; and an inverter that inverts the inverted signal from the latch and generates the redundancy operation control signal.

17. The semiconductor memory device of claim 15, wherein each of the address setting circuits comprises:

a pull-up transistor that pulls up a first node in response to a clock signal;

a plurality of pull-down transistors, the pull-down transistors connecting in parallel to one another, wherein each of the pull-down transistors has a drain connected to the first node, a gate, to which one of the selecting signals is applied, and a source;

a plurality of fuses, each of the fuses serially connecting to the source of one of the pull-down transistors, wherein the fuses commonly connect to a second node;

a pull-down transistor that pulls down the second node in response to the clock signal;

a transmission gate that transfers a signal from the first node in response to the clock signal;

a latch that inverts the signal transferred through the transmission gate and latches and generates an inverted signal; and an inverter that inverts the inverted signal from the latch and generates one of the address signals.

18. The semiconductor memory device of claim 12, wherein the decoding circuit comprises a plurality of decoders.

19. The semiconductor memory device of claim 18, wherein each of the decoders comprises:

a pull-up transistor that pulls up a first node in response to a clock signal;

a plurality of pull-down transistors, the pull-down transistors connecting in parallel to one another, wherein each of the pull-down transistors has a drain connected to the node, a gate, to which one of the selecting signals is applied, and a source;

a plurality of fuses, each of the fuses serially connecting to the source of one of the pull-down transistors, wherein the fuses commonly connect to a second node;

a pull-down transistor that pulls down the second node in response to the clock signal;

a transmission gate that transfers a signal from the first node in response to the clock signal;

a latch that inverts the signal transferred through the transmission gate, and latches and generates an inverted signal; and an inverter that inverts the inverted signal from the latch and generates a data I/O line shifting control signal.

20. A redundancy method for a semiconductor memory device comprising:

generating a redundancy mode signal, the redundancy mode signal identifying which of a plurality of redundancy modes the memory device is employing;

selecting from among a plurality of signals identifying a memory area being accessed a selecting signal corresponding to the redundancy mode signal; and generating a control signal that initiates a replacement of a data I/O line pair associated to a defective block in the memory device, in response to the selecting signal.

21. The redundancy method of claim 20, wherein the control signal indicates a location of the defective data I/O line pair, so that the defective data I/O line pair is replaced by a redundant data I/O line pair.

22. The redundancy method of claim 20, wherein the control signal indicates a location of the defective data I/O line pair, so that data I/O line pairs on one side of the defective data I/O line pair replace the defective data I/O line by shifting one by one until one of the redundant data I/O line pairs is shifted for use.

* * * * *